US006932187B2

(12) United States Patent
Banter et al.

(10) Patent No.: US 6,932,187 B2
(45) Date of Patent: Aug. 23, 2005

(54) PROTECTIVE ACOUSTIC COVER ASSEMBLY

(75) Inventors: Chad A. Banter, Bear, DE (US); Bradley E. Reis, Landenberg, PA (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 10/686,036

(22) Filed: Oct. 14, 2003

(65) Prior Publication Data

US 2005/0077102 A1 Apr. 14, 2005

(51) Int. Cl.[7] .......................... H05K 5/03; H04M 1/20; H04M 9/08

(52) U.S. Cl. ...................... 181/149; 381/189; 379/451; 379/437

(58) Field of Search ......................... 181/149; 381/325, 381/189; 379/439, 452, 451, 437

(56) References Cited

U.S. PATENT DOCUMENTS

| | | | | | |
|---|---|---|---|---|---|
| 3,953,566 | A | | 4/1976 | Gore | 264/288 |
| 3,987,258 | A | * | 10/1976 | Tsutsui et al. | 181/149 |
| 4,071,040 | A | | 1/1978 | Moriarty | 137/199 |
| 4,110,392 | A | | 8/1978 | Yamazaki | 264/127 |
| 4,187,390 | A | | 2/1980 | Gore | 174/102 R |
| 4,194,041 | A | * | 3/1980 | Gore et al. | 442/289 |
| 4,640,382 | A | * | 2/1987 | Hartmann et al. | 181/175 |
| 4,844,778 | A | | 7/1989 | Witte | 204/11 |
| 4,852,683 | A | * | 8/1989 | Killion | 181/130 |
| 4,949,386 | A | | 8/1990 | Hill | 381/188 |
| 4,987,597 | A | | 1/1991 | Haertl | 381/69 |
| 5,116,650 | A | | 5/1992 | Bowser | 428/34.2 |
| 5,222,050 | A | * | 6/1993 | Marren et al. | 381/328 |
| 5,286,279 | A | | 2/1994 | Wu | 95/45 |
| 5,338,287 | A | * | 8/1994 | Miller et al. | 381/326 |
| 5,342,434 | A | | 8/1994 | Wu | 96/13 |
| 5,376,441 | A | | 12/1994 | Wu et al. | 428/304.4 |
| 5,385,694 | A | | 1/1995 | Wu et al. | 252/312 |
| 5,420,570 | A | | 5/1995 | Leitten et al. | 340/574 |
| 5,460,872 | A | | 10/1995 | Wu et al. | 428/304.4 |
| 5,462,586 | A | | 10/1995 | Sugiyama et al. | 96/13 |
| 5,625,688 | A | * | 4/1997 | Ford et al. | 379/433.09 |
| 5,828,012 | A | | 10/1998 | Repolle et al. | 181/175 |
| 6,134,333 | A | * | 10/2000 | Flagler | 181/130 |
| 6,512,834 | B1 | | 1/2003 | Banter et al. | 381/386 |

OTHER PUBLICATIONS

ASTME 1050–90 (Standard Test Method for Impedance Ab sorption of Acoustical Materials Using a Tube, Two Microphones, and a Digital Frequency Analysis System).

* cited by examiner

*Primary Examiner*—Edgardo San Martin
(74) *Attorney, Agent, or Firm*—Allan M. Wheatcraft

(57) ABSTRACT

A protective acoustic cover assembly including a metal foil with perforations, and a treatment on one or more surfaces of said metal foil. The treatment is a hydrophobic or oleophobic treatment, or both. The protective acoustic cover assembly has an average specific acoustic resistance of less than about 11 Rayls MKS from 250–300 Hz, an average specific acoustic reactance magnitude of less than about 1 Rayls MKS from 250–300 Hz, and an instantaneous water entry pressure value of greater than about 11 cm. The perforations of the metal foil preferably have an average maximum pore size of less than about 150 micrometers. The protective acoustic cover assembly further includes an adhesive mounting system, and the preferred metal foil is nickel.

23 Claims, 5 Drawing Sheets

PROTECTIVE ACOUSTIC COVER ASSEMBLY

FIELD OF THE INVENTION

The present invention generally relates to a material providing environmental protection for an acoustic transducer (such as a microphone, ringer or speaker) employed in an electronic device. More specifically, the present invention relates to a protective acoustic cover assembly comprising a treated perforated metal foil that has low acoustic impedance, occupies limited space and has the ability to withstand exposure to dust and liquid intrusion.

BACKGROUND OF THE INVENTION

Most modern electronic devices, such as radios and cellular telephones, contain at least one acoustic transducer (e.g. microphone, ringer, speaker, buzzer, etc.). An acoustic transducer is an electrical component that converts electrical signals into sound, or vice-versa. Acoustic transducers are easily susceptible to being physically damaged, so they are often mounted in a protective housing with apertures located over the position of the acoustic transducer. These apertures enable the system to transmit or receive sound signals with minimal acoustic loss, while simultaneously preventing large debris from entering the housing and damaging the acoustic transducer. These apertures, however, do not protect the acoustic transducer from incidental exposure to liquids (e.g., spills, rain, etc.) or fine dust and other particulate. To protect acoustic transducers from contaminants such as these, protective acoustic covers are typically utilized between the acoustic transducers and the housing, as a supplemental barrier to the housing apertures. A protective acoustic cover is simply a material that prevents unwanted contamination (liquid, particulate, or both) from reaching an acoustic transducer. It is desirable for a protective acoustic cover to accomplish this contamination protection while minimizing the overall impact to the acoustic loss of the system.

The acoustic loss of a system (typically measured in decibels) is based on the characteristic elements/components that comprise the system, such as the housing aperture size, the volume of the cavity between the acoustic transducer and the protective acoustic cover, etc. The impact each element has on the overall acoustic loss of the system, independent of its area, can be determined individually by calculation or test; and this is called specific acoustic impedance.

For most acoustic systems, the ideal protective acoustic cover would have a specific acoustic impedance value as small as possible. In some cases, however, the acoustic system (minus the protective acoustic cover material) may contain sharp resonances at certain frequencies. In this case, a protective acoustic cover with a higher level of acoustic impedance can be effective at dampening the system resonances and ultimately flatten the spectrum for improved sound quality.

Specific acoustic impedance can be measured in Rayls (MKS), and is composed of two terms: specific acoustic resistance and specific acoustic reactance. Specific acoustic resistance affects the specific acoustic impedance in a uniform manner across the frequency spectrum, and is related to viscous losses as air particles pass through the pores of the protective acoustic cover material. These viscous losses are created by either friction of the air particle on the pore walls and/or a less direct air particle path (i.e. tortuous). Specific acoustic reactance, however, tends to affect the specific acoustic impedance in a more frequency-dependent manner, and is related to the movement/vibration of the protective acoustic cover material in use. Because it has a non-uniform behavior with frequency, materials that are highly reactive are typically not selected for use as a protective acoustic cover, unless the application requires high environmental protection.

As a general rule, the larger the pore size in a protective acoustic cover material (all else being equal), the lower the resulting specific acoustic resistance and the lower the level of liquid and particulate protection. Also generally speaking, the thinner the protective acoustic cover material, the lower the specific acoustic resistance, as well. This is because, as the material becomes thinner, lower viscous losses associated with air particles passing through the pores result. Non-porous materials or ones with very tight pore structures, however, tend to transmit sound via mechanical vibration of the material (i.e. reactance), as opposed to physically passing air particles through the pores. Since vibration is required to transmit sound in this case, materials with high flexibility, low mass and less thickness are desired, in order to minimize specific acoustic reactance. These thin, low mass materials, however, can be more delicate, less durable, and more difficult to handle during fabrication and subsequent installation into an electronic device, so very low reactance may not be achievable in practice. The fact that the properties of acoustic resistance, acoustic reactance, durability, manufacturability, and contamination protection are often competing have made it difficult to develop protective acoustic materials that simultaneously meet aggressive acoustic and liquid and particulate protection targets. This has resulted in two major categories of protective acoustic covers: ones that can give high liquid and particulate protection, but with a relatively high specific acoustic impedance (usually dominated by reactance); and ones that offer low specific acoustic impedance, but with an accompanying low level of liquid and particulate protection.

There are several different materials used in the construction of typical protective acoustic covers in use today. Many prior art protective acoustic covers are composed of a porous material constructed of synthetic or natural fibers, formed into either a woven or non-woven pattern. Other protective acoustic cover materials, such as microporous PTFE membranes, contain a network of interconnected nodes and fibrils. Finally, for very harsh or demanding environmental applications, some protective acoustic cover materials are composed entirely of non-porous films, such as polyurethane, Mylar®, etc.

A general description of prior art patents adhering to the above-described scientific principles follows.

U.S. Pat. No. 4,949,386, entitled "Speaker System", teaches a protective acoustic cover comprising in part, a laminated two-layer construction defined by a polyester woven or non-woven material and a microporous polytetrafluoroethylene ("PTFE") membrane. The hydrophobic property of the microporous PTFE membrane prevents liquid from passing through the environmental barrier system. However, although this laminated covering system may be effective in preventing liquid entry into an electronic device, the lamination results in an excessively high specific acoustic impedance (dominated by reactance) which is unacceptable in modern communication electronics where sound quality is a critical requirement.

U.S. Pat. No. 4,987,597 entitled "Apparatus For Closing Openings Of A Hearing Aid Or An Ear Adapter For Hearing Aids" teaches the use of a microporous PTFE membrane as a protective acoustic cover. The membrane effectively restricts liquid passage through the membrane but also results in a high specific acoustic impedance. Additionally, the patent fails to specifically teach the material parameters of the membrane that are required in order to achieve low specific acoustic impedance, although it does generally describe the parameters in terms of porosity and air permeability.

U.S. Pat. No. 5,420,570 entitled "Manually Actuable Wrist Alarm Having A High-Intensity Sonic Alarm Signal" teaches the use of a non-porous film as a protective acoustic cover. As previously discussed, although a non-porous film can provide excellent liquid protection, such a non-porous film suffers from extremely high specific acoustic impedance, which is dominated by reactance. This can produce sound that is excessively muffled and distorted. The high specific acoustic reactance results from the relatively high mass and stiffness associated with typical non-porous films.

U.S. Pat. No. 4,071,040, entitled "Water-Proof Air Pressure Equalizing Valve," teaches the disposition of a thin microporous membrane between two sintered stainless steel disks. Although such a construction may have been effective for its intended use in rugged military-type field telephone sets, it is not desirable for use in modern communication electronic devices because the reactance is extremely high. This is because the two stainless steel disks physically constrain the membrane, limiting its ability to vibrate. Additionally, sintered metal disks are relatively thick and heavy and are thus impractical for lightweight, handheld portable electronic devices.

To overcome some of the shortcomings described above with respect to the '386, '597, '570 and '040 patents, U.S. Pat. No. 5,828,012, entitled "Protective Cover Assembly Having Enhanced Acoustical Characteristics" teaches a protective acoustic cover assembly comprising a membrane that is bonded to a porous support layer in a ring-like pattern. The construction results in an inner, unbonded region surrounded by an outer, bonded region. In this configuration, the membrane layer and the support layer are free to independently vibrate in response to acoustic energy passing therethrough, thereby minimizing the specific acoustic reactance over a completely laminated structure. However, although this construction reduces the reactance of the laminate comparatively, the degree of specific acoustic reactance still remains quite high.

To increase the simplicity, robustness, and improve the liquid protection of the construction described above with respect to the '012 patent, U.S. Pat. No. 6,512,834 entitled "Protective Acoustic Cover Assembly" teaches a protective acoustic cover assembly that eliminates the need for a porous support layer. While this invention provides both improved water intrusion performance and acoustics over the '012 construction, the acoustic reactance still dominates the acoustic impedance.

Although the prior art mentioned above primarily discusses highly reactive materials, most commercially available protective cover materials are typically resistive. Examples of such resistive materials are a polyester woven material with the tradename SAATIFIL ACOUSTEX™ by SaatiTech, a division of the Saati Group, Inc. and nonwoven materials from Freudenberg Nonwovens NA and W. L. Gore & Associates, Inc. As mentioned previously, these materials can have a high specific acoustic resistance, which can be influenced by either their tortuous particle path and/or their increased material thickness. These physical material properties create higher viscous losses associated with the air particles passing through the pores. Because highly resistive materials are often highly undesirable in many applications, materials of this type can be produced with lower specific acoustic resistance, but this is usually accomplished by increasing the pore size of the material. This results in a decrease in the level of liquid and particulate protection.

Because the consumer market desires the use of handheld electronic devices in increasingly harsh environments while simultaneously expecting high reliability and sound quality, the demand for durable, more contamination-resistant and less resistive/reactive protective acoustic cover materials has increased remarkably. Therefore, there exists an unmet need to have a protective acoustic cover with low acoustic resistance, no measurable acoustic reactance, and a high level of water and particulate protection. The acoustic cover should also be durable, and sufficiently rigid to facilitate the use of quick and accurate installation methods. It would also be highly desirable for the protective cover material to offer additional properties and benefits such as: electrical conductivity for EMI shielding, grounding and ESD protection, high temperature and chemical resistance, and compatibility with insert-molding or heat-staking processes to simplify installation into a housing.

The foregoing illustrates limitations known to exist in present protective acoustic cover systems for electronic communication devices. Thus, it is apparent that it would be advantageous to provide an improved protective system to overcome one or more of the limitations set forth above. Accordingly, a suitable alternative is provided including features more fully disclosed hereinafter.

SUMMARY OF THE INVENTION

The present invention provides a protective acoustic cover assembly including a metal foil with perforations, and a treatment on one or more surfaces of said metal foil. The treatment is a modification of the surface of the foil to render it hydrophobic or oleophobic, or both. The protective acoustic cover assembly has an average specific acoustic resistance of less than about 11 Rayls MKS from 250–300 Hz, an average specific acoustic reactance magnitude of less than about 1 Rayls MKS from 250–300 Hz, and an instantaneous water entry pressure value of greater than about 11 cm. The perforations of the metal foil preferably have an average maximum pore size of less than about 150 micrometers. The protective acoustic cover assembly may further include an adhesive mounting system, and the preferred metal foil is nickel.

In another aspect, the present invention provides an apparatus including:

(a) an acoustic transducer;

(b) a housing having at least one aperture, the housing at least partially enclosing the acoustic transducer; and (c) a protective acoustic cover assembly disposed proximate the aperture between the acoustic transducer and the housing, the protective acoustic cover assembly including:

(i) a metal foil with perforations, and (ii) a treatment on one or more surfaces of the metal foil.

In this aspect, the protective acoustic cover assembly is integral with the housing absent any adhesive, for example by insert molding.

In another aspect, the invention provides a method of protecting an acoustic transducer disposed in a housing having an aperture by:

(a) providing a protective acoustic cover assembly disposed proximate the aperture between the acoustic transducer and the housing, the protective acoustic cover assembly comprising:

(i) a metal foil with perforations, and (ii) a treatment on one or more surfaces of the metal foil;

(b) mounting the protective acoustic cover assembly adjacent the aperture to protect the acoustic transducer from particulates and liquid ingress.

DETAILED DESCRIPTION OF THE INVENTION

Figure 1A:
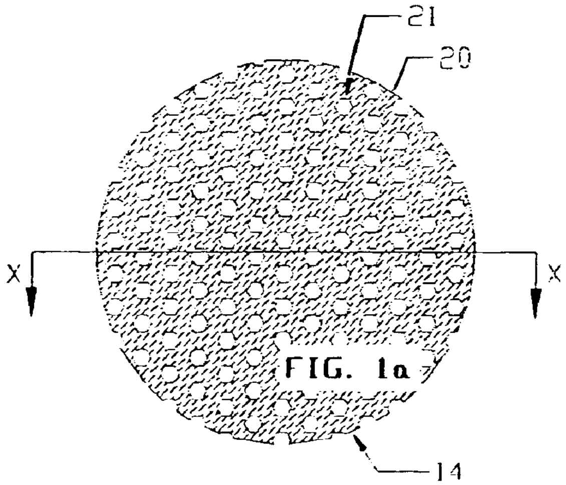
FIG. 1A is a plan view of a protective acoustic cover assembly according to an exemplary embodiment of the invention.

Referring now to the drawings, wherein similar reference characters designate corresponding parts throughout the several views, embodiments of the perforated acoustic cover assembly of the present invention are generally shown in a variety of configurations and dimensioned for use to cover a transducer in a typical electronic device, such as a cellular phone. As should be understood, the present invention is not limited to the embodiments illustrated herein, as they are merely illustrative and can be modified or adapted without departing from the scope of the appended claims.

Figure 1B:
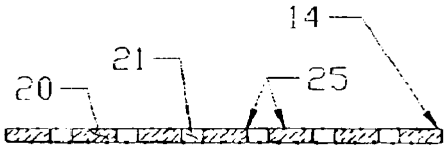
FIG. 1B is a side view of the protective acoustic cover assembly of FIG. 1A.

FIGS. 1*a* and 1*b* show a protective acoustic cover assembly 14, according to a preferred embodiment of the invention. The protective acoustic cover assembly 14 is comprised of a metal foil 20 with perforations 21 and a hydrophobic or oleophobic treatment 25 on one or more of its surfaces. The protective acoustic cover assembly 14 may also comprise a supplementary means of mounting, as shown in FIG. 4*a*–10*b*). The metal foil 20 can be made of any metal material, including but not limited to: nickel, aluminum, copper, silver, lead, platinum, iron, steel, chromium or alloys thereof. A metal such as nickel is preferred for its high electrical conductivity, ability to resist oxidation, mechanical robustness and strength, high temperature resistance, ability to be manufactured via a continuous electroforming process, and other advantageous processing characteristics.

The metal foil 20 should be as thin as possible, while still maintaining physical robustness and ability to be manufactured and installed without damage. The thickness of the foil should be in the range of about 5 to 200 micrometers, and most preferably in the range 10 to 33 micrometers. The perforations 21 in the metal foil 20 should have a maximum pore size (i.e. maximum opening distance within the perforation) in the range of 10 to 1000 micrometers, preferably below 150 micrometers, and most preferably in the range of about 50 to 100 micrometers, for applications requiring both low acoustic impedance and high environmental protection. The perforations 21 may be any shape, but are preferably round, oval, or hexagonal shaped. For most applications, the perforations 21 should preferably be as uniform and equidistant as possible across the metal foil 20 surface, and comprise a percent open area (i.e. the open pore area divided by the total sample area in percentage terms) of less than 65 percent, most preferably in the range of 5 to 45 percent. For applications where a higher resistance is desirable to dampen resonances, perforation sizes and percent open areas may be smaller.

The metal foil 20 with perforations 21 may be manufactured by any of a number of known processes, which produce the perforations 21 in either a separate step after foil production (such as through mechanical punching, laser drilling, photoetching, etc.), or in-situ during the foil production itself (for example by stretching or drawing processes, powder sintering processes, electroforming processes, etc.). An electroforming process is a preferred embodiment for fabrication of the metal foil 20 with perforations 21, since it has the capability of being continuous in nature, thereby allowing for subsequent, cost-effective roll-to-roll processing of the metal foil 20. Electroforming also has the advantage of being able to produce large volumes of perforations, in various shapes and locations, with high uniformity, and at high speeds. Methods to produce such products are disclosed in U.S. Pat. No. 4,844,778 and other patents, can be used.

Still referring to FIGS. 1*a* and 1*b*, the metal foil 20 has a hydrophobic (i.e. water-repellant) and/or oleophobic (i.e. oil-repellant) treatment 25 on at least one of its surfaces, to improve its resistance to liquids such as water, oils, or other low surface tension liquids. For example, the water- and oil-repellent materials and methods disclosed in U.S. Pat.

Nos. 5,116,650, 5,286,279, 5,342,434, 5,376,441 and other patents, can be used. Other oleophobic treatments utilize coatings of fluorinated polymers such as, but not limited to: dioxole/TFE copolymers as those taught in U.S. Pat. Nos. 5,385,694 and 5,460,872, perfluoroalkyl acrylates and perfluoroalkyl methacrylates such as those taught in U.S. Pat. No. 5,462,586, and fluoro-olefins and fluorosilicones. Alternatively, treatment 25 is a surface modification such as by plasma exposure. The treatments described herein in combination with the perforation size, shape, percent open area, and thickness of the metal foil interact to determine the final performance characteristics of the protective acoustic cover material. Accordingly, these features may be varied to optimize the final performance (e.g., acoustic resistance versus liquid protection) depending on the application requirements.

Figure 2:
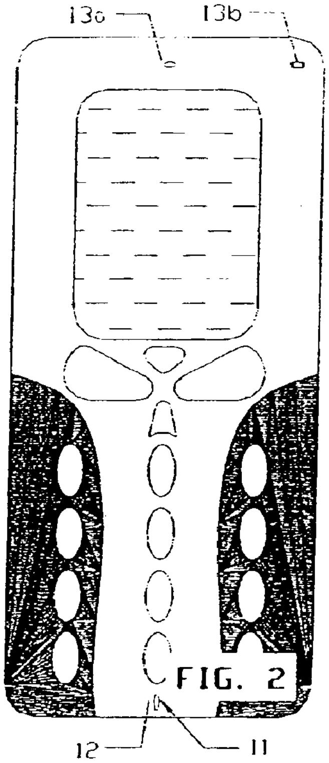
FIG. 2 is a view of the external side of a cellular phone housing according to an exemplary embodiment of the invention.

FIG. 2 shows an external front view of a conventional cellular phone housing 10 having small apertures 11 covering a microphone location 12 and loudspeaker 13*a* and alert 13*b* locations. The number, size and shape of the apertures may vary greatly. Aperture designs include slots, ovals, circles, or other combinations of shapes.

Figure 3:
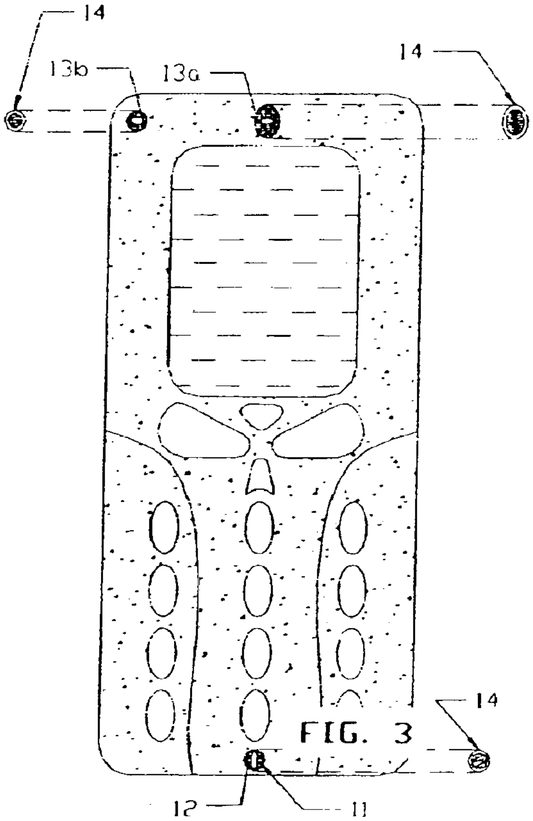
FIG. 3 is a view of the internal side of a cellular phone housing according to an exemplary embodiment of the invention.

FIG. 3 is an internal rear view of the housing 10 illustrating the same microphone location 12 and the loudspeaker and alert locations 13*a* and 13*b*. In addition, FIG. 3 illustrates generally a typical mounting location for protective acoustic cover assemblies 14 which are mounted in the microphone location 12 and the speaker and alert locations 13*a* and 13*b*.

Figure 4A:
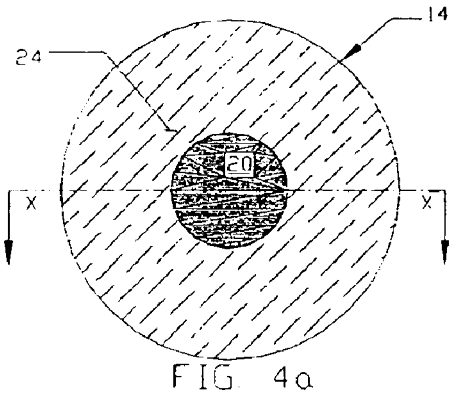
FIG. 4A is a plan view of a protective acoustic cover assembly according to an exemplary embodiment of the invention.
Figure 4B:
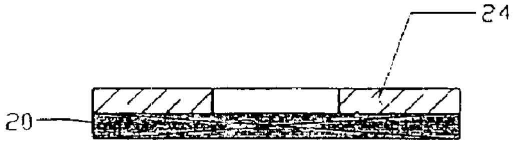
FIG. 4B is a side view of the protective acoustic cover assembly of FIG. 4A.

FIGS. 4*a* and 4*b* illustrate a protective acoustic cover assembly 14 with a means for mounting to a housing 10 (not shown). In this example, an adhesive mounting system 24 is shown bonded to metal foil 20 with perforations 21 and treatment 25 (not shown). The adhesive mounting system 24 can be selected from many known materials well known in the art, such as thermoplastic, thermosetting, pressure-sensitive, or a reaction curing type, in liquid or solid form, selected from the classes including, but not limited to, acrylics, polyamides, polyacrylamides, polyesters, polyolefins, polyurethanes, polysilicons and the like. A pressure-sensitive adhesive mounting system 24 is most preferred, since it does not require heat or curing for mounting. The adhesive mounting system 24 can be applied directly to the metal foil 20 by screen printing, gravure printing, spray coating, powder coating, or other processes well known in the art. The adhesive mounting system 24 may be applied to the metal foil 20 in patterns, such as the ring-like shape shown in FIGS. 4*a* and 4*b*, continuously, using individual points, or in other patterns. For very large acoustic cover assemblies 14 it may be more convenient to use widely separated bond lines instead of discrete bond points. The need for additional bonding points of the protective acoustic cover assembly 14 is dependent on the shape of the area or device to be covered as well as by the size of the protective acoustic cover assembly 14. Thus, some experimentation may be needed to establish the best method and pattern of additional bonding to optimize acoustic performance of the cover assembly 14. In general for a given protective cover assembly, to reduce its acoustic impedance and associated acoustic loss of its system, the area of the open unbonded region(s) or the area with open pores, should be maximized. Additionally, the adhesive mounting system 24 may also comprise a carrier (not shown), such as a mesh or film material, to facilitate application of adhesive mounting system 24 onto metal foil 20.

The adhesive mounting system 24 is simply a convenient means to mount the protective acoustic cover assembly 14 to the housing 10. Other means for mounting the protective acoustic cover assembly 14 to the housing 10 without the use of adhesives include heat staking, ultrasonic welding, press-fits, insert-molding, etc., which are processes well known in the art.

Other protective acoustic cover assembly 14 mounting systems follow in FIGS. 5*a*–9*b*.

Figure 5A:
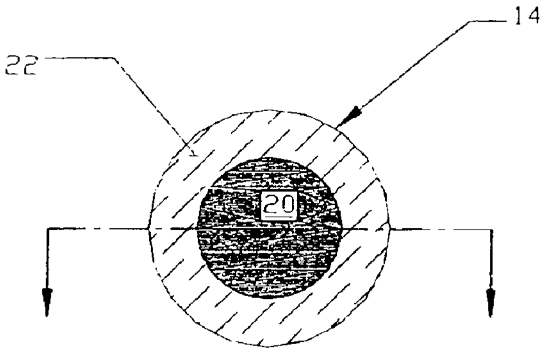
FIG. 5A is a plan view of a protective acoustic cover assembly according to an exemplary embodiment of the invention.
Figure 5B:
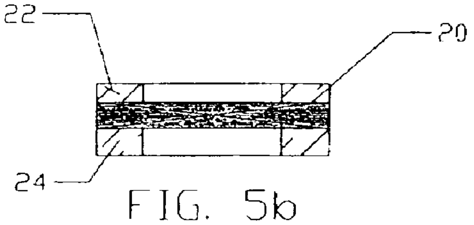
FIG. 5B is a side view of the protective acoustic cover assembly of FIG. 5A.

FIGS. 5*a* and 5*b* illustrate an acoustically transparent "sandwich construction" embodiment of a protective acoustic cover assembly 14 of the present invention. A "sandwich construction" describes the configuration of the protective acoustic cover assembly 14, where a metal foil 20 with perforations 21 and treatment 25 is generally "sandwiched" between a first adhesive support system 22 and a second adhesive support system 24. The adhesive support systems 22 and 24 are preferably bonded so that an inner unbonded region of the metal foil 20 surrounded by an outer bonded region is formed. In the unbonded region of the metal foil 20, the combination of the two adhesive support systems 22 and 24 provides focused acoustic energy between a transducer and the housing 10, resulting in lower acoustic loss.

Figure 6A:
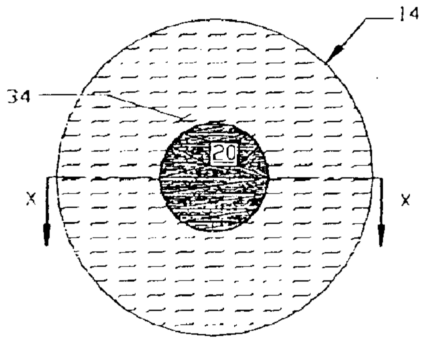
FIG. 6A is a plan view of a protective acoustic cover assembly according to an exemplary embodiment of the invention.
Figure 6B:
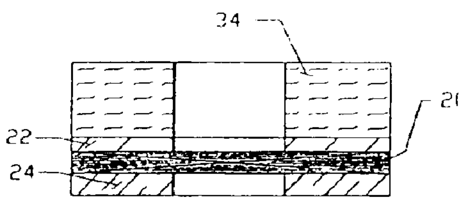
FIG. 6B is a side view of the protective acoustic cover assembly of FIG. 6A.

FIGS. 6*a* and 6*b* illustrate an embodiment of a "sandwich construction" protective acoustic cover assembly 14 as shown in FIGS. 5*a* and 5*b*, wherein an acoustic gasket 34 is bonded to the first adhesive mounting system 22. In this embodiment, the first adhesive mounting system 22 is a double-sided adhesive. The acoustic gasket 34 is attached to the first adhesive mounting system 22 and is designed to be compressed between a housing 10 and the acoustic transducer or PCB (not shown), so as to provide a seal and thus avoid acoustic leakage, as discussed in U.S. Pat. No. 6,512,834. Conventional commercially-available materials are known in the art and are suitable for use as the acoustic gasket 34 material. For example, soft elastomeric materials or foamed elastomers, such as silicone rubber and silicone rubber foams, can be used. A preferred acoustic gasket 34 material is a microporous PTFE material, and more preferably, a microporous ePTFE having a microstructure of interconnected nodes and fibrils, as described in U.S. Pat. Nos. 3,953,566, 4,187,390, and 4,110,392, which are incorporated herein by reference. Most preferably, the acoustic gasket 34 material comprises a matrix of microporous PTFE, which may be partially filled with elastomeric materials. These types of gaskets can offer thin profiles while also providing very low compression forces. Other types of acoustic gasket 34 materials might include a metal-plated or particle-filled polymer that provides features such as conformability and electrical conductivity. The acoustic gasket 34 can be bonded to the cover materials using the methods and materials for bonding together the metal foil 20 and adhesive mounting systems 22 and 24.

Figure 7A:
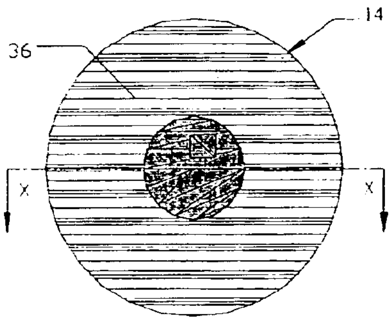
FIG. 7A is a plan view of a protective acoustic cover assembly according to an exemplary embodiment of the invention.
Figure 7B:
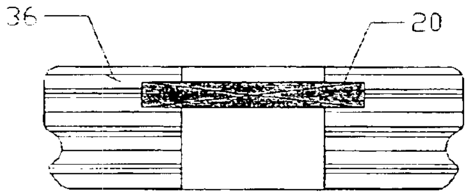
FIG. 7B is a side view of the protective acoustic cover assembly of FIG. 7A.
Figure 8A:
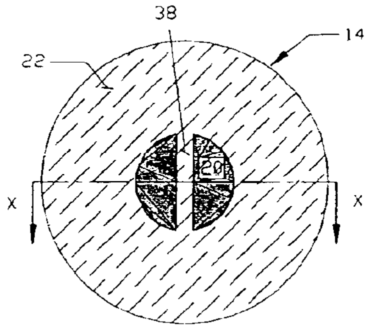
FIG. 8A is a plan view of a protective acoustic cover assembly according to an exemplary embodiment of the invention.
Figure 8B:
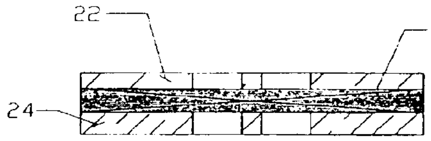
FIG. 8B is a side view of the protective acoustic cover assembly of FIG. 8A.
Figure 9A:
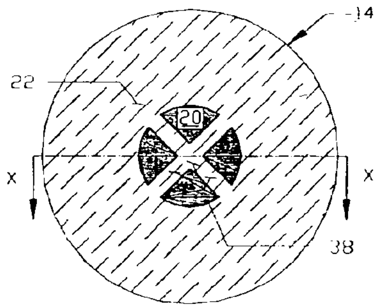
FIG. 9A is a plan view of a protective acoustic cover assembly according to an exemplary embodiment of the invention.
Figure 9B:
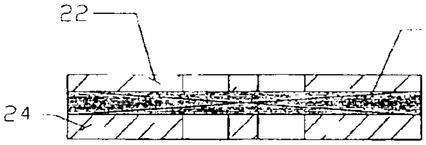
FIG. 9B is a side view of the protective acoustic cover assembly of FIG. 9A.

FIGS. 7*a* and 7*b* illustrate an alternative embodiment of a protective acoustic cover assembly 14 where the metal foil 20 with perforations 21 and treatment 25 is insert-molded into a plastic cap 36. Vulcanizable plastics, like silicones or natural rubber, and thermoplastics, like polypropylene, polyethylene, polycarbonates or polyamides, as well as thermoplastic elastomers, like Santoprene® or Hytrel®, are particularly suitable as a material for the plastic cap 36, though many other plastic materials may be used as well. Most of these plastics can be used in the so-called insert-molding injection-molding process, which offers the significant advantage of integrating a metal foil 20 into a plastic cap 36 in one step. This type of process can offer high bond strength while also providing cost benefits. The metal foil 20, owing to its high temperature resistance, is particularly compatible with such an insert-molding process without damage to it. Although the metal foil 20 is illustrated as being molded in the middle of the plastic cap 36, it should be understood that other locations and techniques are possible (i.e. the metal foil 20 may be molded into a groove formulated in any vertical position on the cap 36.) FIGS. 8*a*, 8*b*, 9*a* and 9*b* are also "sandwich construction" embodiments as described above in all aspects, except that a supplemental bonding site 38 within the adhesive mounting system 22 and 24 spans across the metal foil 20. The supplemental bonding site 38 provides support for a protective cover assembly 14 with a relatively large inner unbonded region as discussed above. Although the supplemental bonding site 38 shown in the example has a defined geometry it should be noted that alternative supplemental bonding site geometries are possible and will be well understood by those skilled in the art.

Figure 10A:
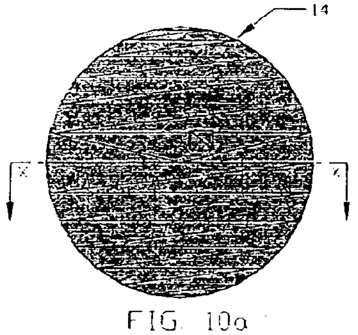
FIG. 10A is a plan view of a protective acoustic cover assembly according to an exemplary embodiment of the invention.
Figure 10B:
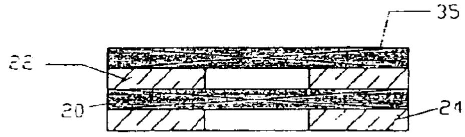
FIG. 10B is a side view of the protective acoustic cover assembly of FIG. 10A.

FIGS. 10*a* and 10*b* illustrate an additional embodiment of the "sandwich construction" protective cover assembly 14 as shown in FIGS. 5 and 6, wherein a second perforated material layer 35 is bonded to the first adhesive support system 22. In this embodiment, the first adhesive support system is a double-sided adhesive. The second perforated material layer 35 is also a double-sided adhesive and attached so as to provide a gap between the two perforated material layers. The addition of the second perforated material layer 35 will result in higher acoustic resistance, in part, because of the additional viscous losses associated with the additional pores; but will also provide improved water protection because the porous path through the two layers of perforated material will become less direct and more tortuous. This additional protection against liquid is desirable in some applications and in these cases will outweigh the slight increase in acoustic resistance.

Test Methods (1) Acoustic Transmission Loss

Figure 11:
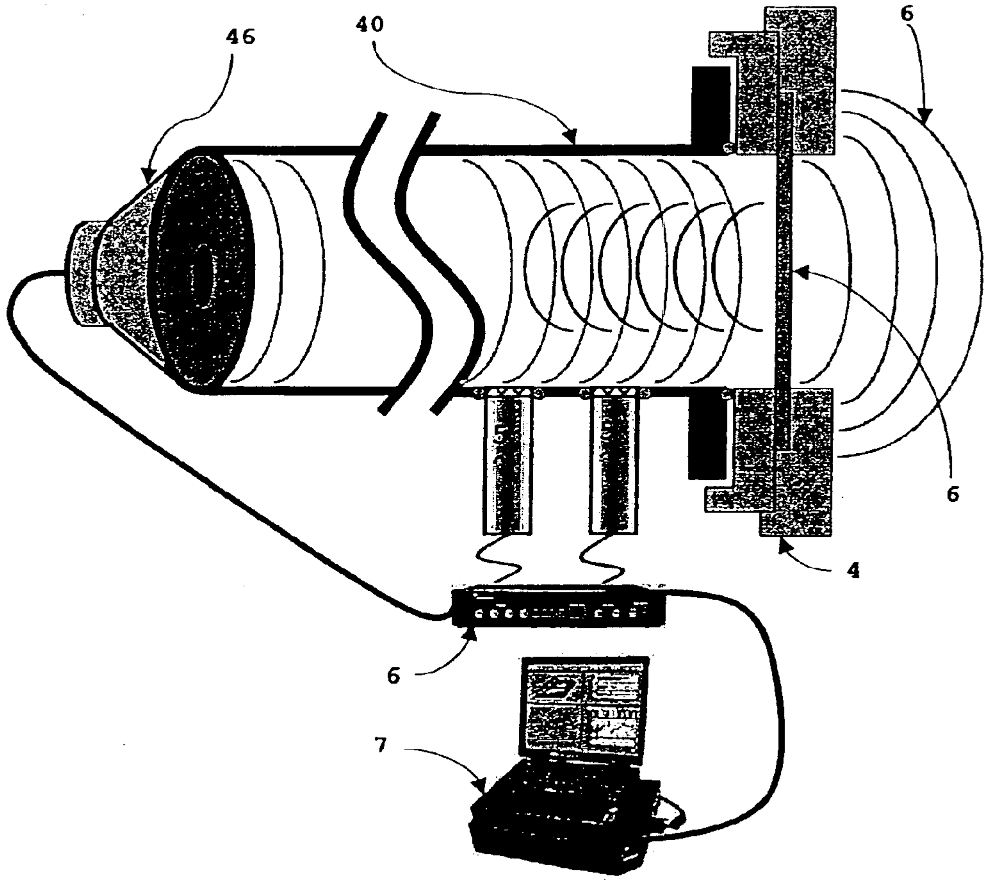
FIG. 11 is a schematic of a test device used to measure acoustic transmission loss.

Samples were tested and evaluated using the analysis procedures and methodology as described in ASTM E 1050-90, (Standard Test Method for Impedance and Absorption of Acoustical Materials Using a Tube, Two Microphones, and a Digital Frequency Analysis System). However, a modification to the ASTM standard was required to accurately evaluate the metal foil 20 and other similar porous protective acoustic cover material samples. These modifications to the ASTM standard will be more readily understood and apparent when read in conjunction with the following description and while viewing accompanying drawings of the test sample holder in FIG. 11.

The primary exception to ASTM 1050-90 is the use of a Test Specimen Holder 44 that has an open-end termination instead of a closed-end termination. The open-end termination measurement is utilized to closely represent acoustic systems used in typical electronic devices and is more accurate when measuring thin, porous products.

Initially, the test specimen holder 66 is installed on the impedance tube 42 without a sample material 44. A computer 70 communicates with the function generator/analyzer 60 which generates white noise and drives the speaker 46. Sound waves 68 from the speaker 46 propagate down the tube 42. At the end of the sample holder, some sound waves 68 reflect back and microphones 50 and 52 measure the transfer function at the location where a sample is normally positioned. From the transfer function, the acoustic impedance (albeit "radiation) is measured. This impedance measurement without a sample material 66 is then saved in a computer 70 for post processing. Upon completion of the radiation impedance test, a sample material 66 is placed into the test specimen holder 44 and the impedance test is again performed. The radiation impedance is then simply subtracted from measured impedance of the sample to acquire the specific acoustic impedance of the sample material 66. This is calculated using the specific acoustic impedance equation delineated in ASTM 1050-90 in conjunction with the following equation:

$$Z_{sample\text{-}radiation}=Z_{with\ sample}-Z_{radiation}$$

This procedure for measurement provides an accurate and simple metric for comparing the specific acoustic impedance of a material. The results can also be evaluated at a particular discrete or range of frequencies to determine any acoustic impedance frequency dependence within the material.

Additionally, the specific acoustic resistance Rs can be derived from the "complex" specific acoustic impedance Z by extracting the "real" part. Alternatively, extracting the "imaginary" part of the acoustic impedance will yield the specific acoustic reactance Xs, which is often displayed as a magnitude (i.e. values displayed are positive numbers). For metal foil 20 with perforations 21 as outlined above and other highly porous materials, the specific acoustic resistance Rs will typically dominate the acoustic impedance. For nonporous materials or those with very tight pore structures, the specific acoustic reactance Xs will dominate the acoustic impedance. Both components are useful in determining acoustic performance, although the acoustic resistance may be more representative when measuring highly porous materials.

(2) Instantaneous Water Entry Pressure ("I-WEP")

Figure 12:
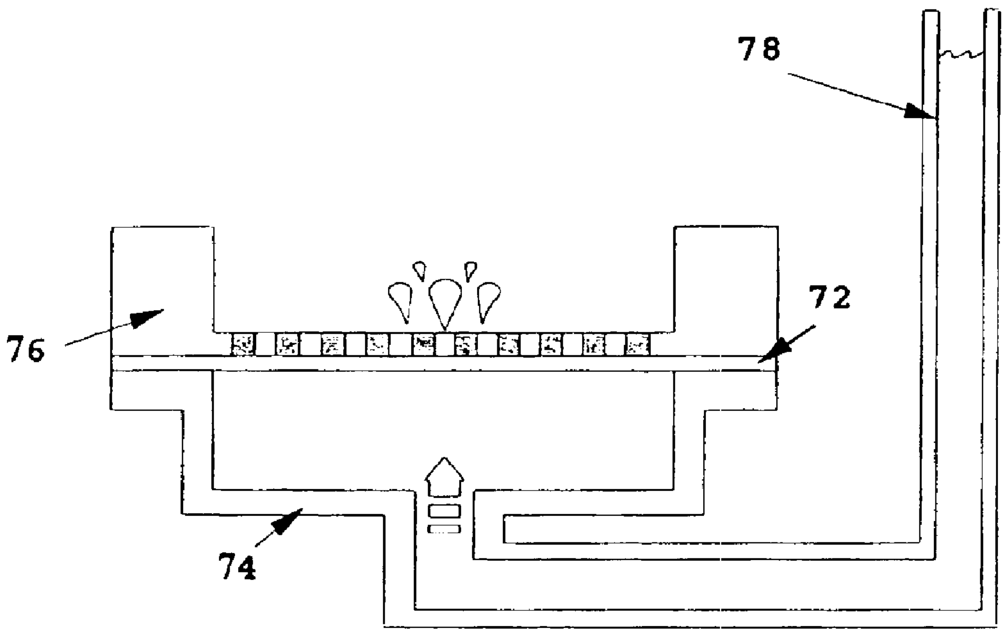
FIG. 12 is a schematic of a test device used to measure instantaneous water entry pressure.

Instantaneous Water Entry Pressure ("I-WEP") provides a test method for water intrusion through highly porous materials. I-WEP is a measure of the sample's repellency or ability to serve as an aqueous barrier. This is an important property to consider and measure when designing electronic devices for water resistance applications. An illustration of the test device used to quantify I-WEP performance is shown in FIG. 12.

Initially, the test sample 72 is placed over the pressure cup 74. The clamping screen 76 is then secured and sealed to the pressure cup 74 to hold the sample securely in place. The water pressure in the pressure cup 74 is then gradually increased at a constant rate of 2.5 cm/second by way of a water column 78 until evidence of water breakthrough occurs. The water pressure at breakthrough is then recorded as the I-WEP.

(3) Average Maximum Pore Size

Using an optical microscope with micron-sized measurement capabilities and a backlight, ten random pores within a sample are visually inspected and the largest opening within the pore is measured and recorded. These ten values are then averaged to give an average maximum pore size.

EXAMPLE 1

Hydrophobic Perforated Nickel Foil

A perforated nickel foil material manufactured by Stork Veco B.V. was provided comprising the following nominal properties: thickness—0.0005" (12 micrometers); average maximum pore size—87 micrometers; percent open area—45%. A disc, 35 mm diameter, was cut from the material. A treatment was prepared using Teflon AF fluoropolymer from DuPont. The treatment consisted of 0.15% by weight of the Teflon AF in 99.85% by weight solvent, which was TF5070 from 3M. An adequate amount of coating solution was poured into a petri dish and the sample was fully immersed using tweezers. The sample was subsequently suspended in a fume hood for approximately 10 minutes. Specific acoustic resistance and reactance, along with I-WEP were tested according to the test methods outlined above. A comparison of the results from these tests are shown in Table 1 along with the material properties of thickness, and average maximum pore size.

COMPARATIVE EXAMPLE 1

Hydrophobic Porous Woven Material Made With Polyester

This example is a commercially available protective cover material sold under the tradename SAATIFIL ACOUSTEX™ B010 by SaatiTech, a division of the Saati Group, Inc. The product consists of a polyester woven material. The material had the following nominal properties: thickness—105 micrometers; average maximum pore size—158 micrometers; percent open area—41%. A disc, 35 mm diameter, was cut from the material. Specific acoustic resistance and reactance, along with I-WEP were tested as described above. A comparison of the results from these tests are shown in Table 1 along with the material properties of thickness, and average maximum pore size.

COMPARATIVE EXAMPLE 2

Hydrophobic Porous Non-Woven Material Made With Polyester

This example is a commercially available protective cover material sold under the tradename GORE™ PROTECTIVE COVER GAW101 manufactured by W. L. Gore & Associates, Inc. The product consists of a black, non-woven cellulose material. The material had the following nominal properties: thickness—150 micrometers; average maximum pore size—56 micrometers. A disc, 35 mm diameter, was cut from the material. Specific acoustic resistance and reactance, along with I-WEP were tested as described above. A comparison of the results from these tests are shown in Table 1 along with the material properties of thickness, and average maximum pore size.

COMPARATIVE EXAMPLE 3

Microporous PTFE Material

This example is a commercially available protective cover material sold under the tradename GORE™ PROTECTIVE COVER GAW314 manufactured by W. L. Gore & Associates, Inc. The product consists of a black, ePTFE based material. The material had the following nominal properties: thickness—20 micrometers; average maximum pore size—0.45 micrometers. A disc, 35 mm diameter, was cut from the material. Specific acoustic resistance and reactance, along with I-WEP were tested as described above. A comparison of the results from these tests are shown in Table 1 along with the material properties of thickness, and average maximum pore size.

TABLE 1

| | Average Acoustic Impedance from 250 to 300 Hz (MKS Rayls) | | Average Water Intrusion | Other Nominal Material Properties | |
|---|---|---|---|---|---|
| Examples | Resistance | Reactance (magnitude) | Performance I-WEP (cm) | Thickness ($\mu$m) | Avg. Max Pore Size ($\mu$m) |
| Example 1 | 9 | 0 | 20 | 12 | 90 |
| Comparative 1 | 11 | 1 | 11 | 105 | 158 |
| Comparative 2 | 64 | 7 | 15 | 150 | 56 |
| Comparative 3 | 5 | 86 | >300 | 20 | 0.45 |

As can be seen from Table 1, the exemplary embodiment of this invention illustrated by Example 1 has improved average acoustic impedance over all of the Comparative Examples, which includes no measurable reactance. Additionally, Example 1 has a smaller maximum pore size than the closest Comparative Example 1, thereby providing a higher level of particulate protection. Example 1 provides these improvements while still maintaining a high level of water entry protection, sufficient for most wireless portable device applications, for example. If necessary, the water entry protection of Example 1 could be even further improved using other coating treatments described herein. The material of Example 1 has the further advantages over the Comparative Examples of being electrically conductive, and compatible with standard insert molding processes.

What is claimed is:

1. A protective acoustic cover assembly comprising:

(i) a metal foil with perforations, and (ii) a treatment on one or more surfaces of said metal foil, wherein said protective acoustic cover assembly has an average specific acoustic resistance of less than about 11 Rayls MKS from 250–300 Hz.

2. The protective acoustic cover assembly comprising:

(i) a metal foil with perforations, and (ii) a treatment on one or more surfaces of said metal foil, wherein said protective acoustic cover assembly has an average specific acoustic resistance magnitude of less than about 1 Rayls MKS from 250–300 Hz.

3. The protective acoustic cover assembly of claim 1, wherein said protective acoustic cover assembly has an instantaneous water entry pressure value of greater than about 11 cm.

4. The protective acoustic cover assembly of claim 1 wherein said perforations have an average maximum pore size of less than about 150 micrometers.

5. The protective acoustic cover assembly of claim 1 wherein said treatment is a hydrophobic treatment.

6. The protective acoustic cover assembly of claim 1 wherein said treatment is an oleophobic treatment.

7. The protective acoustic cover assembly of claim 1 further comprising an adhesive mounting system.

8. The protective acoustic cover assembly of claim 1 wherein said metal foil is nickel.

9. A protective acoustic cover assembly comprising:

(i) a metal foil with perforations, and (ii) a treatment on one or more surfaces of said metal foil, wherein said protective acoustic cover assembly has an average specific acoustic resistance of less than about 11 Rayls MKS from 250–300 Hz, an average specific acoustic reactance magnitude of less than about 1 Rayls MKS from 250–300 Hz, an instantaneous water entry pressure value of greater than about 11 cm; and wherein said perforations have an average maximum pore size of less than about 150 micrometers; and wherein said metal foil is nickel.

10. An apparatus comprising:

(a) an acoustic transducer;

(b) a housing having at least one aperture, said housing at least partially enclosing said acoustic transducer;

(c) a protective acoustic cover assembly disposed proximate said aperture between said acoustic transducer and said housing, said protective acoustic cover assembly comprising:

(i) a metal foil with perforations, and (ii) a treatment on one or more surfaces of said metal foil, wherein said protective acoustic cover assembly has an average specific acoustic resistance of less than about 11 Rayls MKS from 250–300 Hz.

11. An apparatus comprising:

(a) an acoustic transducer;

(b) a housing having at least one aperture said housing at least partially enclosing said acoustic transducer;

(c) a protective acoustic cover assembly disposed proximate said aperture between said acoustic transducer and said housing, said protective acoustic cover assembly comprising:

(i) a metal foil with perforations, and (ii) a treatment on one or more surfaces of said metal foil, wherein said protective acoustic cover assembly has an average specific acoustic reactance magnitude of less than about 1 Rayls MKS from 250–300 Hz.

12. The apparatus of claim 10, wherein said protective acoustic cover assembly has an instantaneous water entry pressure value of greater than about 11 cm.

13. The apparatus of claim 10 wherein said perforations have an average maximum pore size of less than about 150 micrometers.

14. The apparatus of claim 10 wherein said treatment is a hydrophobic treatment.

15. The apparatus of claim 10 wherein said treatment is an oleophobic treatment.

16. The apparatus of claim 10 wherein said protective acoustic cover assembly further comprises an adhesive mounting system.

17. The apparatus of claim 10 wherein said metal foil is nickel.

18. The apparatus of claim 10, wherein said protective acoustic cover assembly is integral with said housing absent any adhesive.

19. An apparatus comprising:

(a) an acoustic transducer;

(b) a housing having at least one aperture, said housing at least partially enclosing said acoustic transducer;

(c) a protective acoustic cover assembly disposed proximate said aperture between said acoustic transducer and said housing, said protective acoustic cover assembly comprising:

(i) a metal foil with perforations having an average maximum pore size of less than about 150 micrometers, and (ii) a hydrophobic or oleophobic treatment on one or more surfaces of said metal foil;

(iii) an average specific acoustic resistance of less than about 11 Rayls MKS from 250–300 Hz;

(iv) an average specific acoustic reactance magnitude of less than about 1 Rayls MKS from 250–300 Hz; and (v) an instantaneous water entry pressure value of greater than about 11 cm.

20. A method of protecting an acoustic transducer disposed in a housing having an aperture comprising the steps of:

(a) providing a protective acoustic cover assembly disposed proximate said aperture between said acoustic transducer and said housing, said protective acoustic cover assembly comprising:

(i) a metal foil with perforations, and (ii) a treatment on one or more surfaces of said metal foil;

wherein said protective acoustic cover assembly has an average specific acoustic resistance of less than about 11 Rayls MKS from 250–300 Hz;

(b) mounting said protective acoustic cover assembly adjacent said aperture to protect said acoustic transducer from particulates and liquid ingress.

21. The method of claim 20 wherein said metal foil is nickel.

22. The method of claim 20 wherein said perforations have an average maximum pore size of less than about 150 micrometers.

23. The method of claim 20 wherein said protective acoustic cover assembly has an instantaneous water entry pressure value of greater than about 11 cm.

* * * * *

UNITED STATES PATENT AND TRADEMARK OFFICE

CERTIFICATE OF CORRECTION

PATENT NO. : 6,932,187 B2
APPLICATION NO. : 10/686036
DATED : August 23, 2005
INVENTOR(S) : Chad A. Banter and Bradley E. Reis It is certified that error appears in the above-identified patent and that said Letters Patent is hereby corrected as shown below:

<u>Column 12,</u>
Line 20, "The" should read -- A --.
Line 24, "resistance" should read -- reactance --.

Signed and Sealed this

Twenty-seventh Day of June, 2006

JON W. DUDAS
*Director of the United States Patent and Trademark Office*